US010111358B2

(12) United States Patent
Wu et al.

(10) Patent No.: US 10,111,358 B2
(45) Date of Patent: Oct. 23, 2018

(54) SERVER DEVICE

(71) Applicant: Super Micro Computer Inc., San Jose, CA (US)

(72) Inventors: Chaoching Wu, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/494,140

(22) Filed: Apr. 21, 2017

(65) Prior Publication Data
US 2018/0242472 A1 Aug. 23, 2018

(30) Foreign Application Priority Data
Feb. 20, 2017 (TW) .............................. 106202435 U

(51) Int. Cl.
*H05K 7/00* (2006.01)
*H05K 7/14* (2006.01)

(52) U.S. Cl.
CPC ......... *H05K 7/1489* (2013.01); *H05K 7/1487* (2013.01)

(58) Field of Classification Search
None
See application file for complete search history.

(56) References Cited

U.S. PATENT DOCUMENTS

| | | | |
|---|---|---|---|
| 5,340,340 A * | 8/1994 | Hastings | G06F 1/181 312/223.1 |
| 7,679,896 B2 * | 3/2010 | Deng | G06F 1/187 312/223.1 |
| 8,570,733 B2 * | 10/2013 | Long | G06F 1/187 211/26 |
| 2006/0034048 A1 * | 2/2006 | Xu | G06F 1/184 361/679.32 |
| 2012/0104222 A1 * | 5/2012 | Ding | G06F 1/187 248/634 |
| 2012/0162956 A1 * | 6/2012 | Gong | G11B 33/124 361/810 |

* cited by examiner

*Primary Examiner* — Courtney Smith
*Assistant Examiner* — Rashen E Morrison
(74) *Attorney, Agent, or Firm* — Chun-Ming Shih; HDLS IPR Services

(57) ABSTRACT

A server device includes a chassis, a rail assembly, and a server. The rail assembly is fixed inside the chassis. The rail assembly includes a lateral board and a flange. The lateral board is arranged vertically, the flange protrudes from one side of the lateral board, the flange is arranged horizontally and extends horizontally in a long strip shape, a positioning flexible arm is disposed on the lateral board, and the positioning flexible arm and the flange protrude from the same side of the lateral board. The server is loaded on the flange and movable along the flange, the server includes a front portion and a rear portion opposite to the front portion. When the server is entirely received in the chassis, the front portion is fixed to one end of the rail assembly, and the positioning flexible arm is engaged with an outer surface of the rear portion.

15 Claims, 17 Drawing Sheets

SERVER DEVICE

TECHNICAL FIELD

The present invention relates to a server and, in particular, to a server device having a rail assembly fastening a front side and a rear side of a server loaded on the rail assembly.

BACKGROUND

A commonly-used server device typically includes a chassis and a server accommodated in the chassis. For convenient maintenance of the server, a sliding rail is connected between the server and an inner side of the chassis, so that the server can be pulled out of the chassis conveniently. However, in some limited space environments, the size of the chassis has to be reduced to fit in a limited space, and consequently, there is no sufficient space inside the chassis for placing the slide rail. Thus, some server devices have to abandon the use of the slide rail, and choose a simple rail assembly instead to hold the server, but the server is not connected to the rail assembly.

The conventional sliding rail can limit horizontal linear movement of the server, and at the same time it can also avoid vertical movement of the server. By contrast, in the current simple rail assembly products, although the server loaded thereon can move horizontally and linearly along the rail assembly, the rail assembly cannot properly limit vertical displacement. That is to say, after the server is placed in the chassis, a front side of the server is fixed by screws to a front end of the rail assembly, but a rear side of the server is still not fixed, so the server is easily damaged by collision and shaking during conveyance of the chassis.

Accordingly, in order to solve the above disadvantages, the inventor studied related technology and provided a reasonable and effective solution in the present disclosure.

SUMMARY

The present invention provides a server device having a rail assembly capable of fastening a front side and a rear side of a server loaded on the rail assembly.

The present invention provides a server device. The server device includes a chassis, a rail assembly, and a server. The server assembly is fixed inside the chassis. The rail assembly includes a lateral board and a flange, the lateral board is arranged vertically, the flange protrudes from one side of the lateral board, the flange is arranged horizontally and extends horizontally in a long strip shape, the lateral board is disposed with a positioning flexible arm, and the positioning flexible arm and the flange protrude from the same side of the lateral board. The server is loaded on the flange and is slidable along the flange. The server includes a front portion and a rear portion opposite to the front portion. When the server is entirely received in the chassis, the front portion is fixed to one end of the rail assembly, and the positioning flexible arm is engaged with an outer surface of the rear portion.

In the server device of the present invention, the positioning flexible arm is disposed at the other end of the rail assembly, another positioning flexible arm is disposed between two ends of the rail assembly so as to be engaged with the rear portion of the server when the server is partially removed from the chassis. The flange is formed on an edge of the lateral board, one end of the lateral board is fixed to the front portion, and the positioning flexible arm is disposed on the other end of the lateral board. Another positioning flexible arm is disposed between two ends of the lateral board so as to be engaged with the rear portion of the server when the server is partially removed from the chassis.

In the server device of the present invention, the rail assembly includes an extension board connected to the lateral board in an overlapping manner, one end of the lateral board is fixed to the chassis, and one end of the extension board is fixed to the chassis.

In the server device of the present invention, a slide groove is formed on the lateral board, and the extension board is disposed with a limiting pin correspondingly inserted in the slide groove. The limiting pin is screw-connected to the extension board to compress and fix the lateral board to the extension board.

In the server device of the present invention, a slide groove is formed on the extension board, and the lateral board is disposed with a limiting pin correspondingly inserted in the slide groove. The limiting pin is screw-connected to the lateral board to compress and fix the extension board to the lateral board.

In the server device of the present invention, a slide groove is formed on the lateral board, the extension board is disposed with a limiting pin correspondingly inserted in the slide groove, and the lateral board is disposed with another limiting pin inserted in the corresponding another slide groove on the extension board.

In the server device of the present invention, an operation hole is formed on the lateral board, a protruding portion for engaged with the server is formed on a middle section of the positioning flexible arm, one end of the positioning flexible arm is fixed at one side of the operation hole, the protruding portion is inserted in the operation hole, and the protruding portion and the flange protrude from the same side of the lateral board. A positioning slot and an assembly hole communicating with the positioning slot are disposed on the other end of the positioning flexible arm, a positioning pin is arranged protrudingly at the other side of the operation hole, a block portion is formed at a distal end of the positioning slot, the block portion has a width ranging between a width of the positioning slot and a diameter of the assembly hole, and the positioning pin is inserted in the positioning slot.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Figure 1:
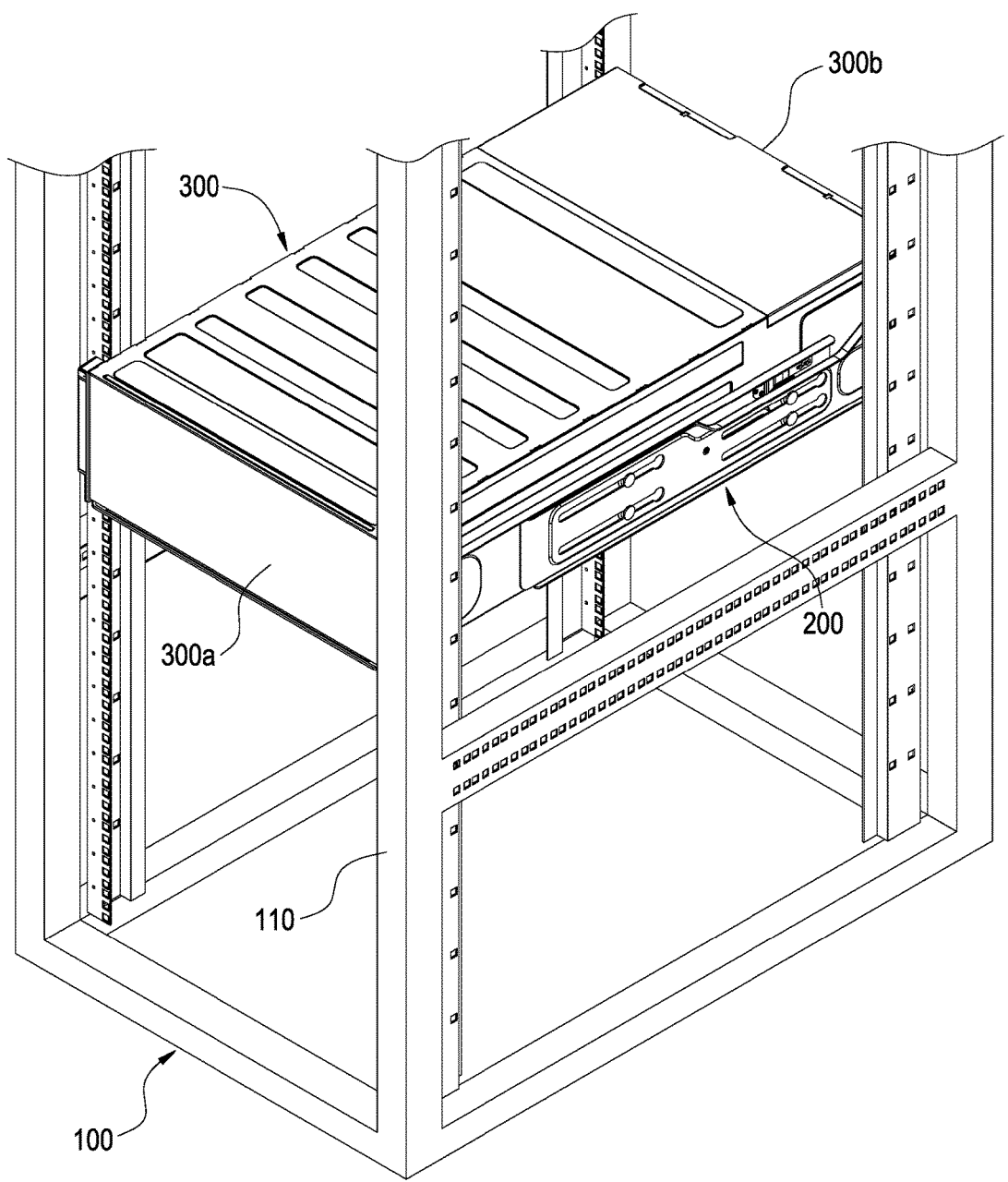
FIGS. 1 to 3 are perspective views showing a server device according to one embodiment of the present invention.
Figure 2:
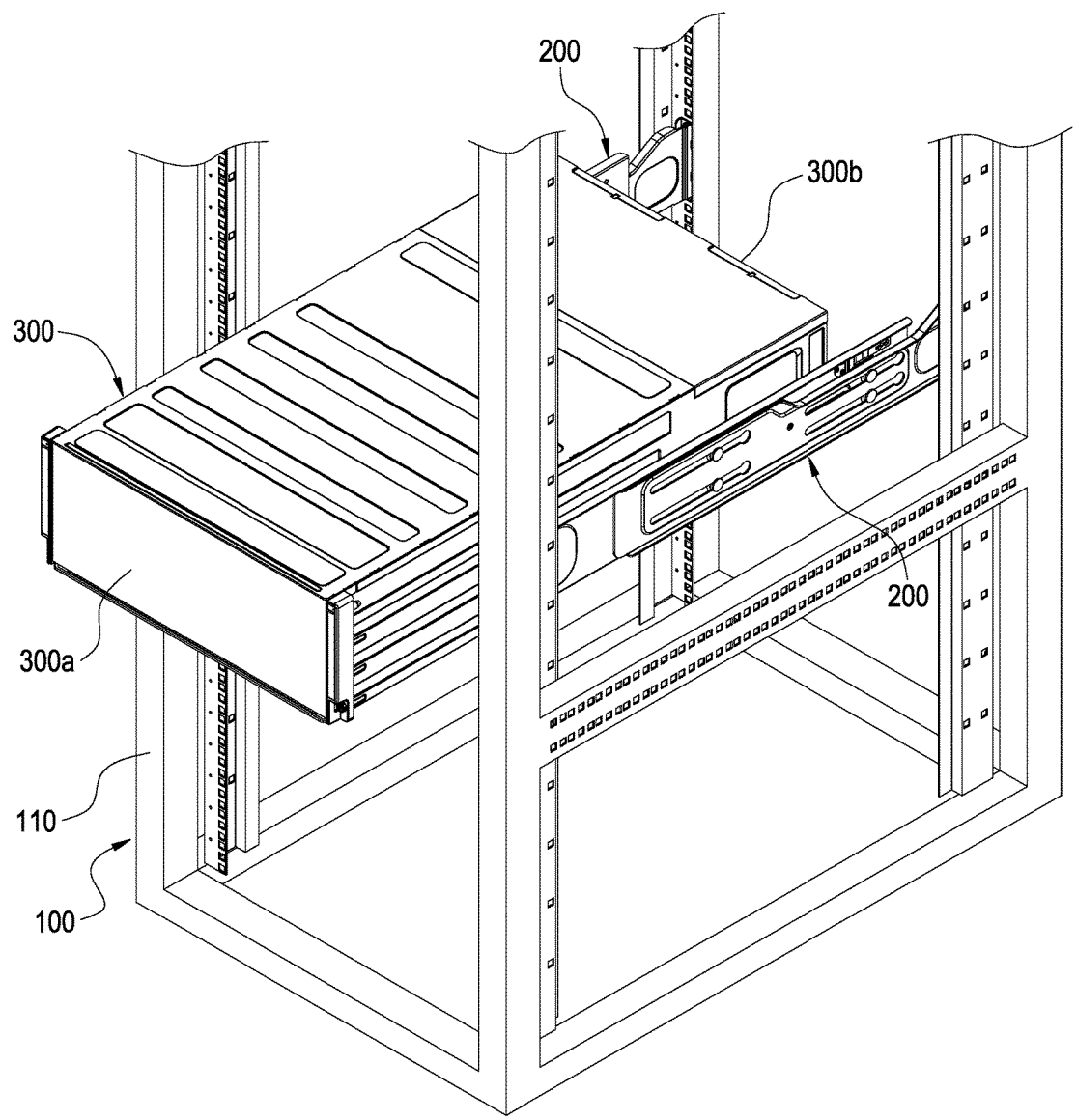
Figure 3:
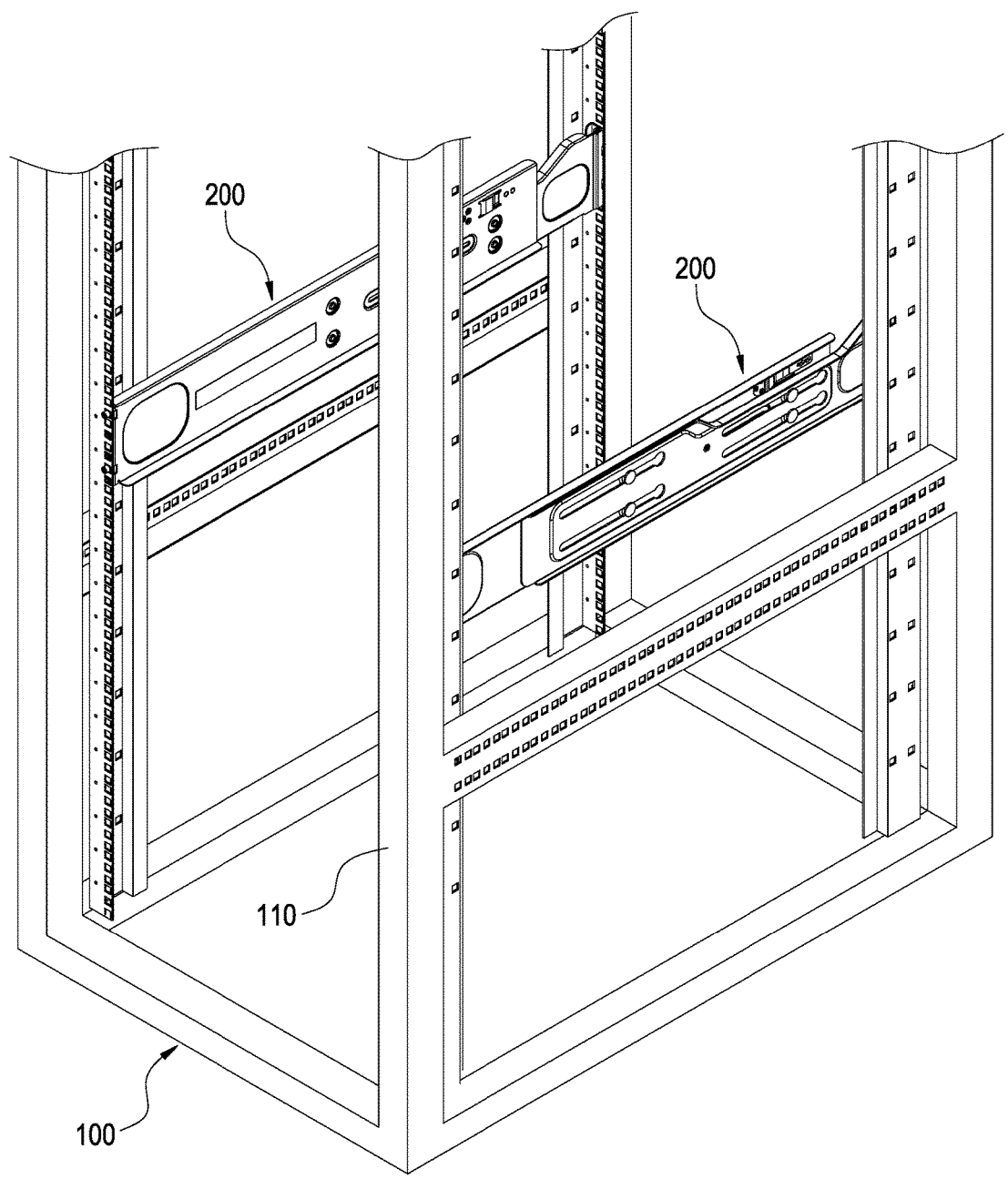
Figure 4:
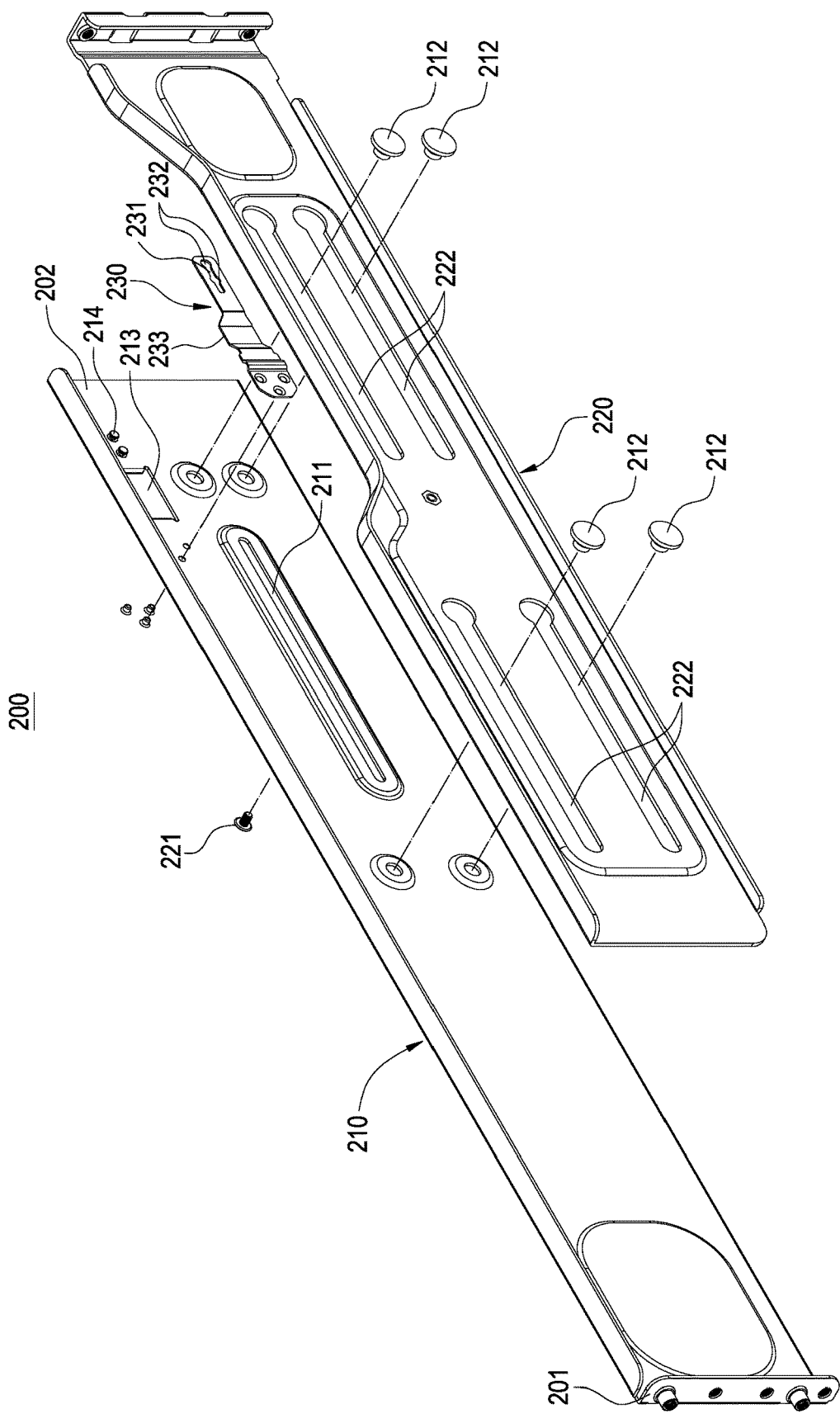
FIG. 4 is a perspective exploded view showing a rail assembly in the server device according to one embodiment of the present invention.
Figure 5:
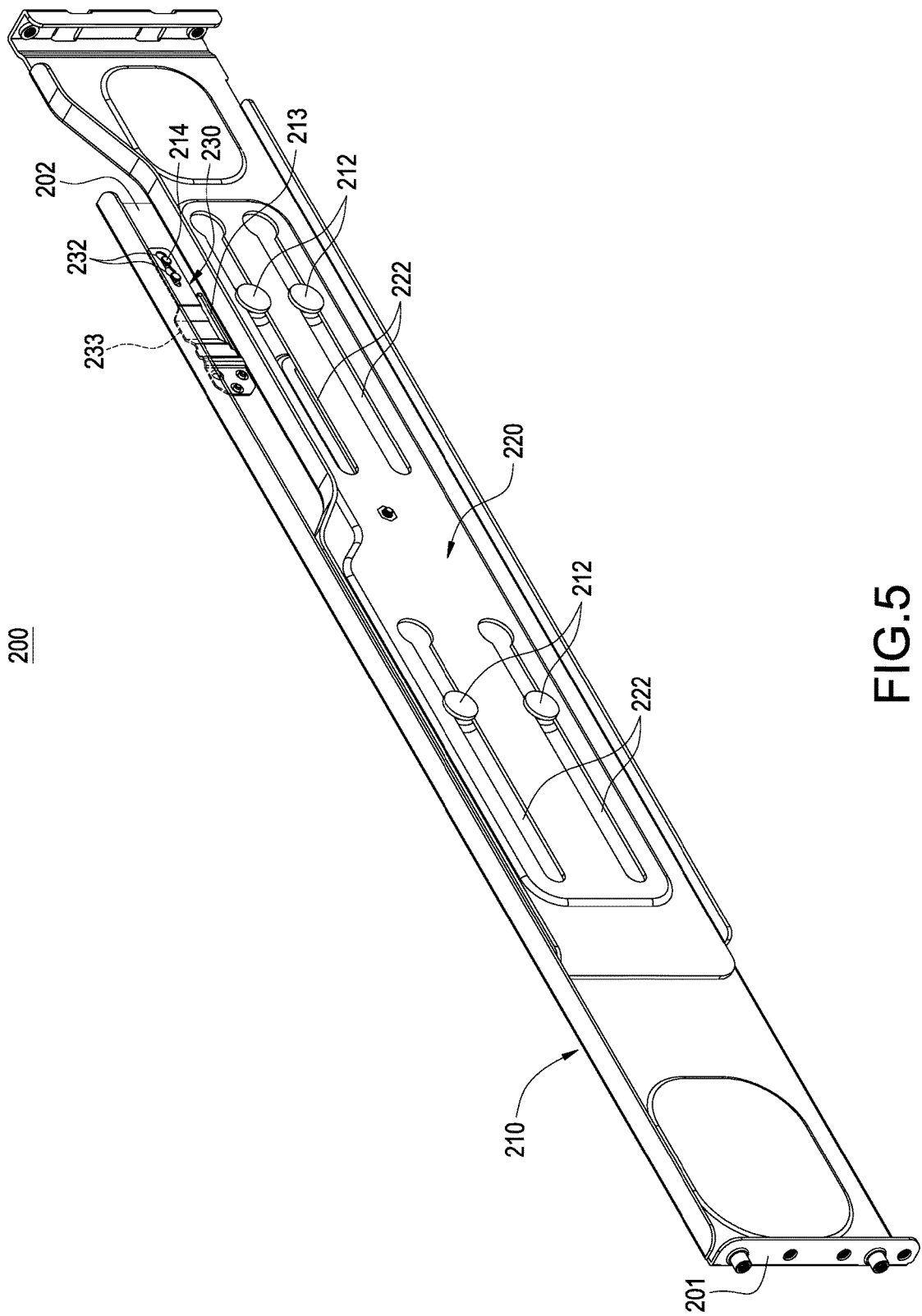
FIGS. 5 and 6 are perspective views showing the rail assembly in the server device according to one embodiment of the present invention.
Figure 6:
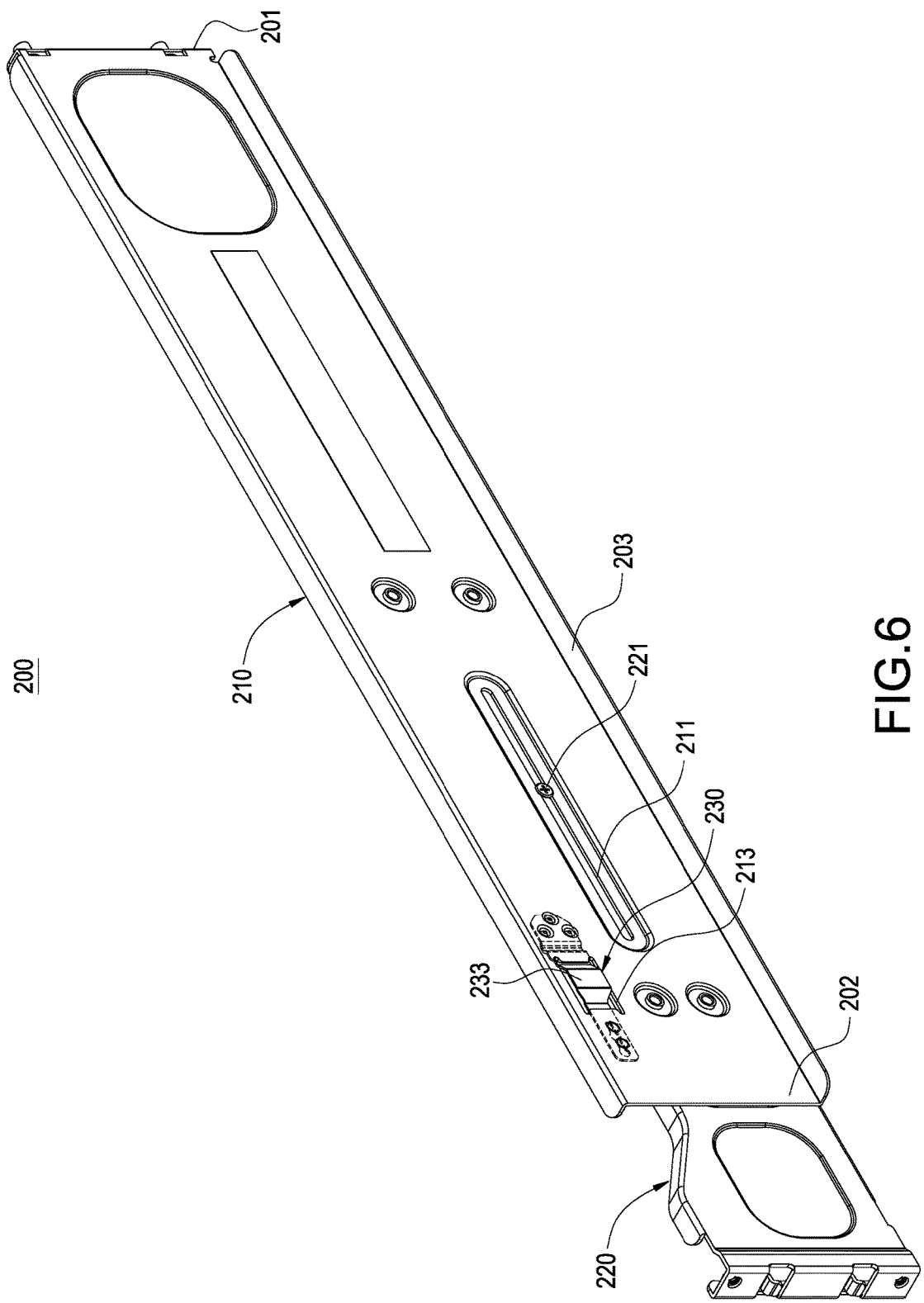
Figure 7:
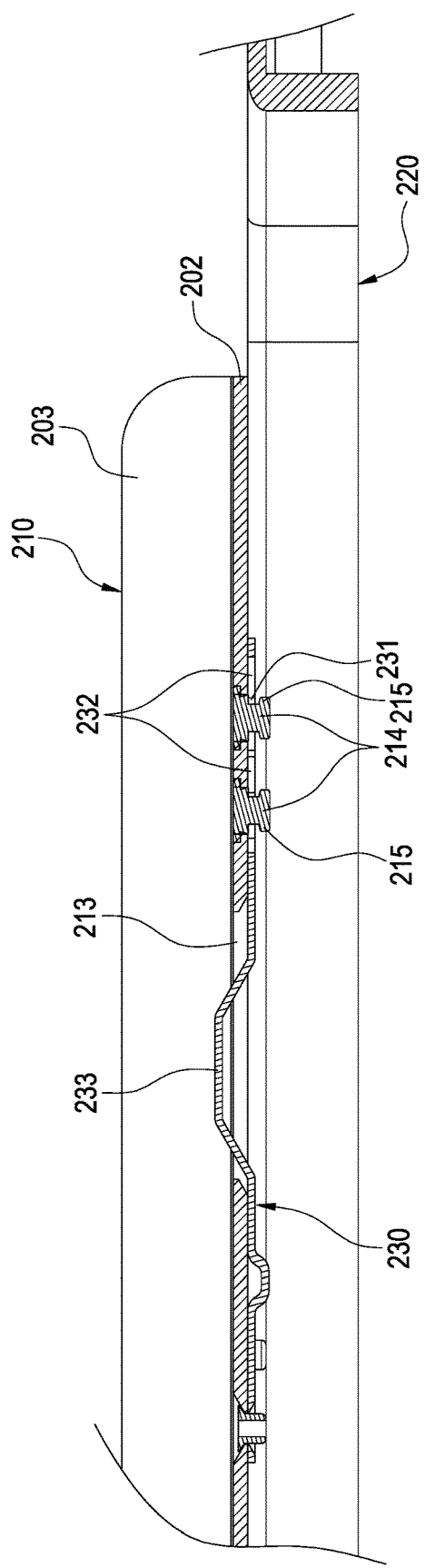
FIG. 7 is a longitudinal cross-sectional view showing the rail assembly in the server device according to one embodiment of the present invention.
Figure 8:
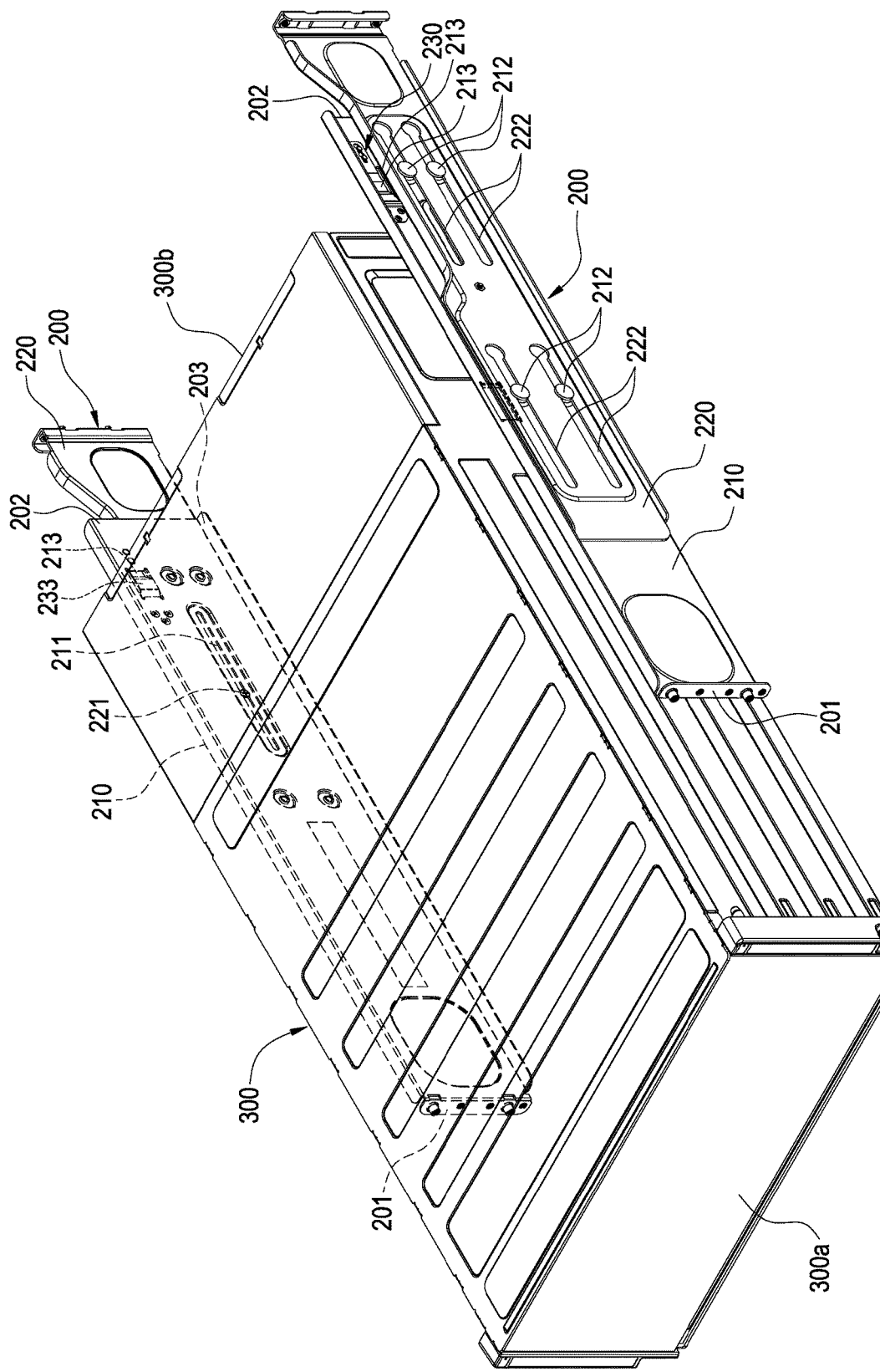
FIGS. 8 to 10 are schematic views illustrating configuration of the rail assembly in the server device according to one embodiment of the present invention.
Figure 9:
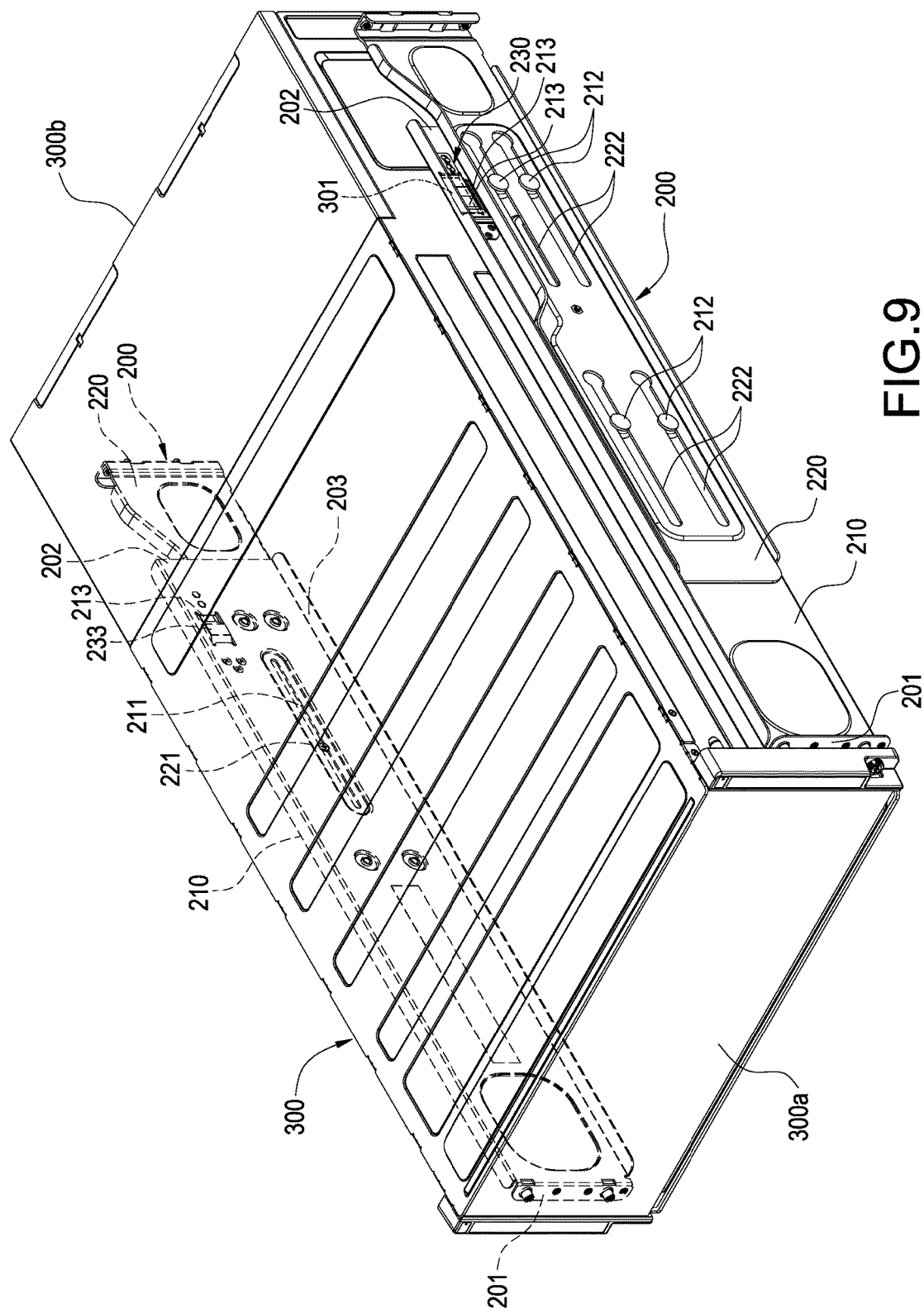
Figure 10:
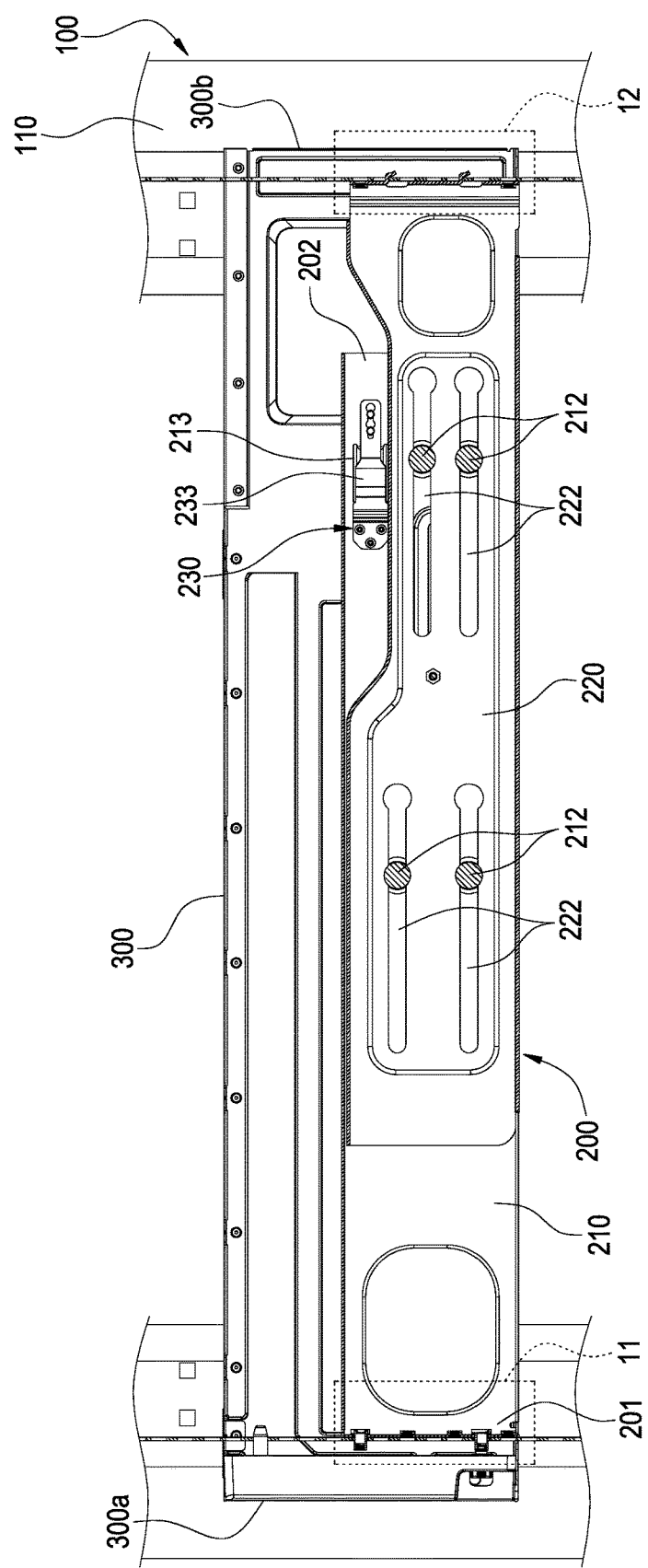
Figure 11:
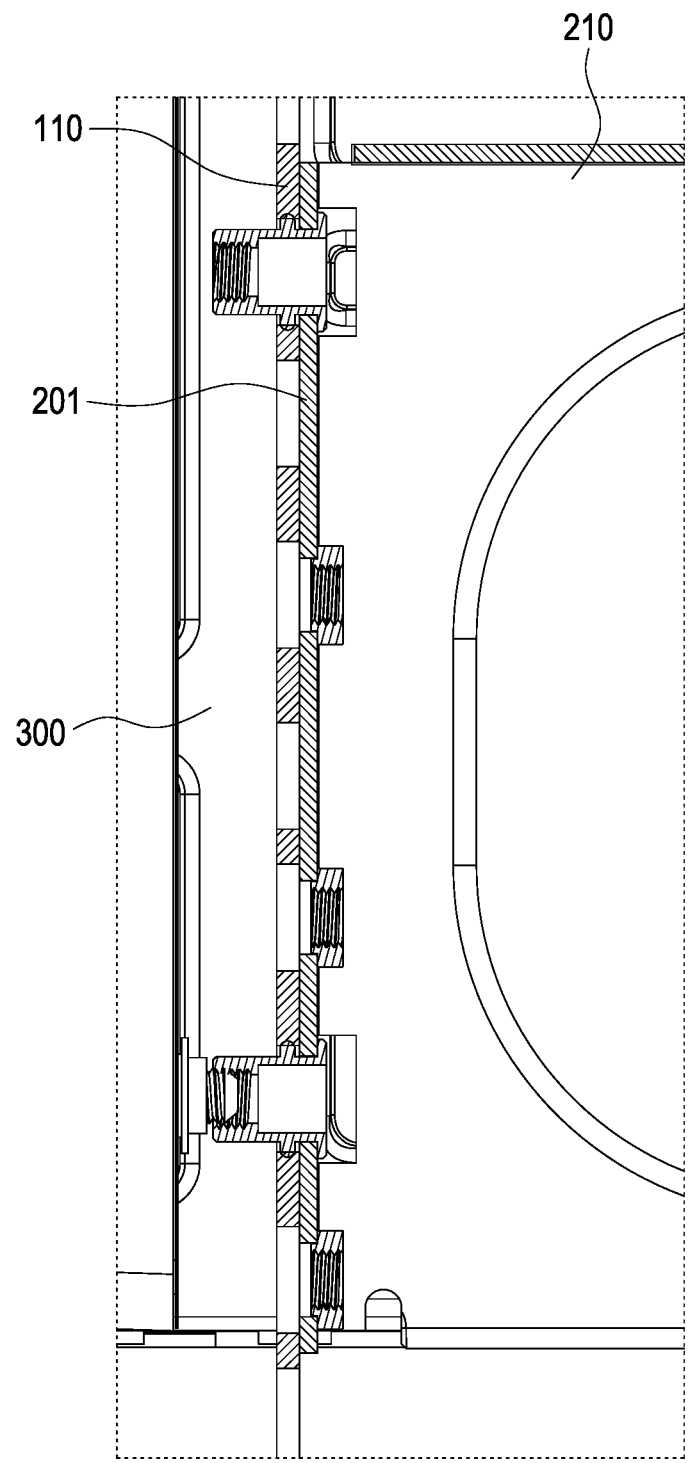
FIGS. 11 and 12 are partial enlarged views illustrating areas 11 and 12 in FIG. 10.
Figure 12:
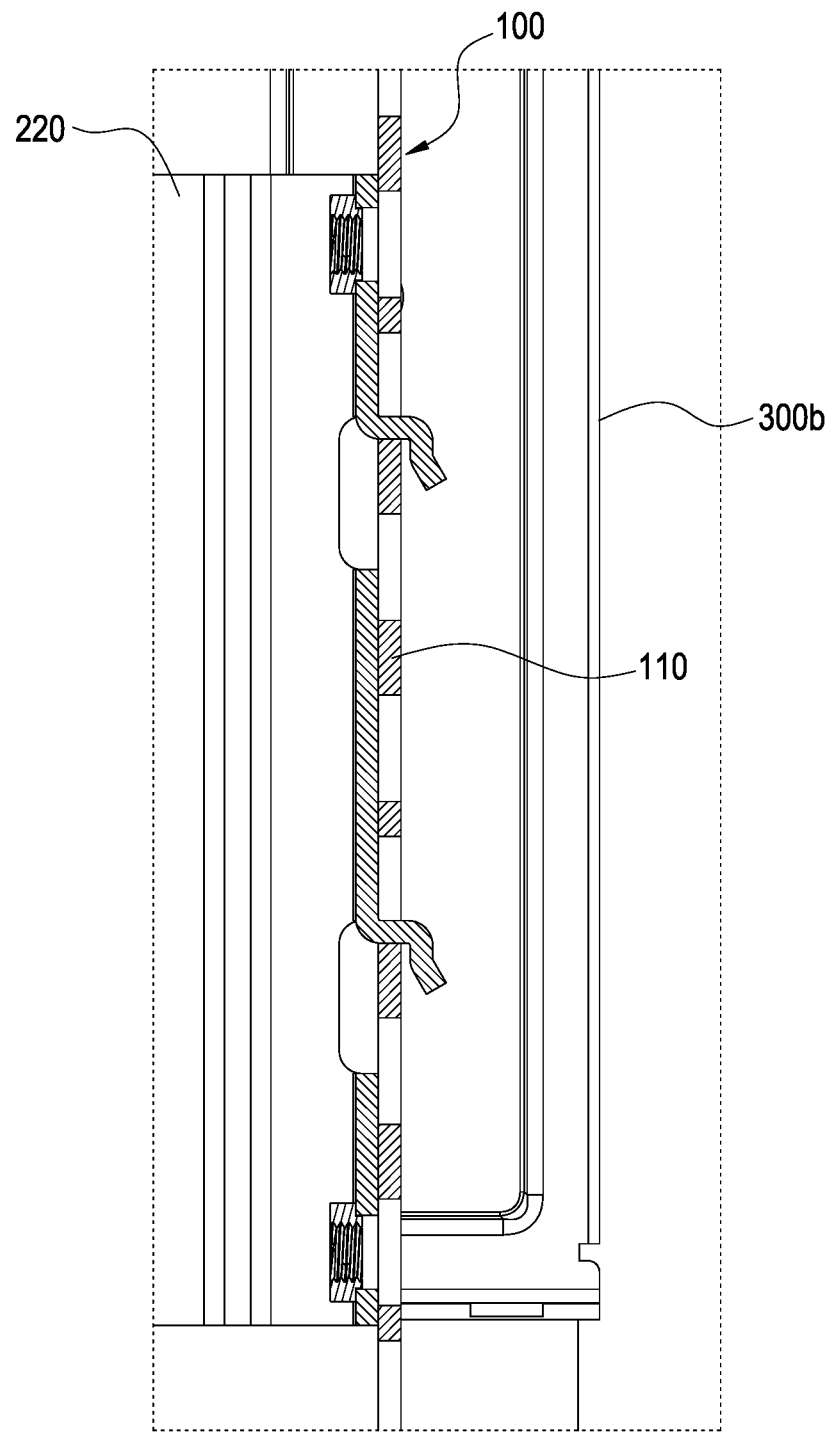
Figure 13:
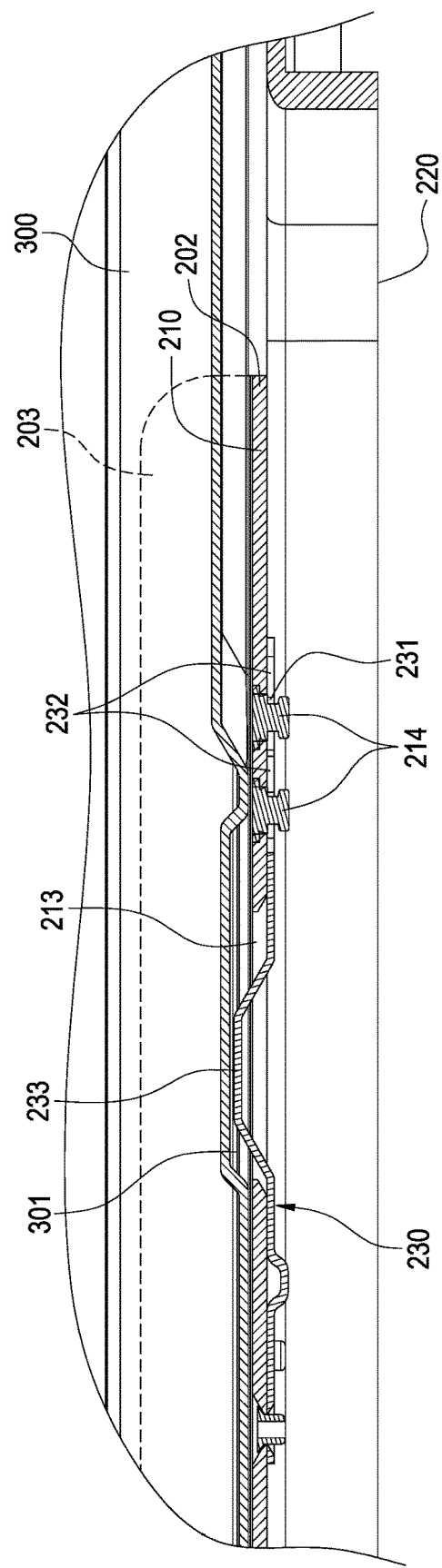
FIG. 13 is a schematic in-use view illustrating the rail assembly in the server device according to one embodiment of the present invention.

Please refer to FIGS. 1 to 3, showing a server device 300 according to one embodiment of the present invention. The server device 300 includes a chassis 100, at least one rail assembly 200 and a server 300 accommodated in the chassis 100 and loaded on the corresponding rail assembly 200.

In the present embodiment, the chassis 100 at least includes a frame 110, and the frame 110 can be covered by a cover plate (not illustrated) or a door panel (not illustrated).

Referring to FIGS. 4 to 7, the rail assembly 200 is fixed inside the chassis 100 and is preferably fixed onto the frame 110. In the present embodiment, there are preferably two rail assemblies 200, with the same structure and functions, disposed in the chassis 100. However, the present invention is not limited to any particular number of the rail assemblies 200. The rail assembly 200 includes a lateral board 210 and an extension board 220 connected to the lateral board 210 in an overlapping manner. The lateral board 210 is arranged vertically and extends horizontally.

Referring to FIGS. 8 to 12, two ends of the lateral board 210 are a front end 201 and a rear end 202, respectively. The front end 201 of the lateral board 210 is fixed to one side of the frame 110. One end of the extension board 220 protrudes further than the rear end 202 of the lateral board 210 and is fixed to the other side of the frame 110, so that the rail assembly 200 extends horizontally; however, the present invention is not limited in this regard. For example, the rail assembly 200 can include the lateral board 210 only, without having the extension board 220, and two ends of the lateral board 210 are respectively fixed to two opposite sides of the frame 110 in such a manner that the rail assembly 200 extends horizontally. In the present embodiment, a slide groove 211 is formed on the lateral board 210, and the extension board 220 is disposed with a limiting pin 212 correspondingly inserted in the slide groove 211, so that the lateral board 210 and the extension board 220 can slide longitudinally with respect to each other along the rail assembly 200 so as to adjust a length of the rail assembly 200 to fit to a size of the frame 110. However, the present invention is not limited in this regard. For example, a slide groove 222 can be formed on the extension board 220, the lateral board 210 is disposed with the limiting pin 212 correspondingly inserted in the slide groove 222.

In the present embodiment, it is preferable that the limiting pin 212 is screw-connected to the extension board 220 to compress and fix the lateral board 210 to the extension board 220, and thereby the lateral board 210 and the extension board 220 are clamped together by the limiting pin 212. However, the present invention is not limited in this regard. A swapped configuration is also feasible, in which the limiting pin 212 is screw-connected to the lateral board 210 to compress and fix the extension board 220 to the lateral board 210, and thereby the lateral board 210 and the extension board 220 are clamped together by the limiting pin 212.

In the present embodiment, a flange 203 protrudes from one side edge of the lateral board 210, the flange 203 is arranged horizontally and extends longitudinally in a long strip shape along the lateral board 210, and the flange 203 protrudes from one side of the lateral board 210 and protrudes into the inside of the frame 110. An operation hole 213 is formed on the rear end 202 of the lateral board 210, a positioning flexible arm 230 corresponding to the operation hole 213 is disposed on the rear end 202 of the lateral board 210. In the present embodiment, a protruding portion 233 is formed on a middle section of the positioning flexible arm 230, the protruding portion 233 is inserted in the operation hole 213, and the protruding portion 233 and the flange 203 protrude from the same side of the lateral board 210. A positioning slot 231 and an assembly hole 232 communicating with the positioning slot 231 are disposed on one end of the positioning flexible arm 230, a positioning pin 214 corresponding to the positioning slot 231 is arranged protrudingly at one side of the operation hole 213, a block portion 215 is formed at a distal end of the positioning pin 214, the block portion 215 has a width ranging between a width of the positioning slot 231 and a diameter of the assembly hole 232, so that the block portion 215 can pass through the assembly hole 232 to insert the positioning pin 214 in the positioning slot 231, and to fix the other end of the positioning flexible arm 230 to the other side of the operation hole 213. In this way, the block portion 215 prevents the positioning pin 214 from being detached from the positioning slot 231.

Referring to FIGS. 1, 2, 8, 9 and 13, the server 300 is accommodated inside the frame 110, and the server 300 is preferably loaded on the flange 203 of the rail assembly 200 and is movable along the flange 203 to be removed out of the frame 110 or to be moved into the frame 110. The server 300 preferably includes a front portion 300a and a rear portion 300b opposite to the front portion 300a. An engagement hole 301 is formed on an outer surface of the rear portion 300b of the server 300. The engagement hole 301 can be a through hole 302 or a blind hole. When the server 300 is entirely received inside the chassis 100, the front end 201 of the lateral board 210 of the rail assembly 200 is screw-connected with the front portion 300a of the server 300, and the protruding portion 233 of the positioning flexible arm 230 is engaged with the engagement hole 301 to fasten the rear portion 300b of the server 300. By this configuration, the present invention prevents the server 300 from being damaged by collisions and shaking during conveyance of the chassis 100. Moreover, when the server 300 is pulled, an inner edge of the engagement hole 301 pushes the protruding portion 233 to make the positioning flexible arm 230 move to thereby remove the protruding portion 233 from the engagement hole 301, and thus the server 300 is slidable along the rail assembly 200.

Figure 14:
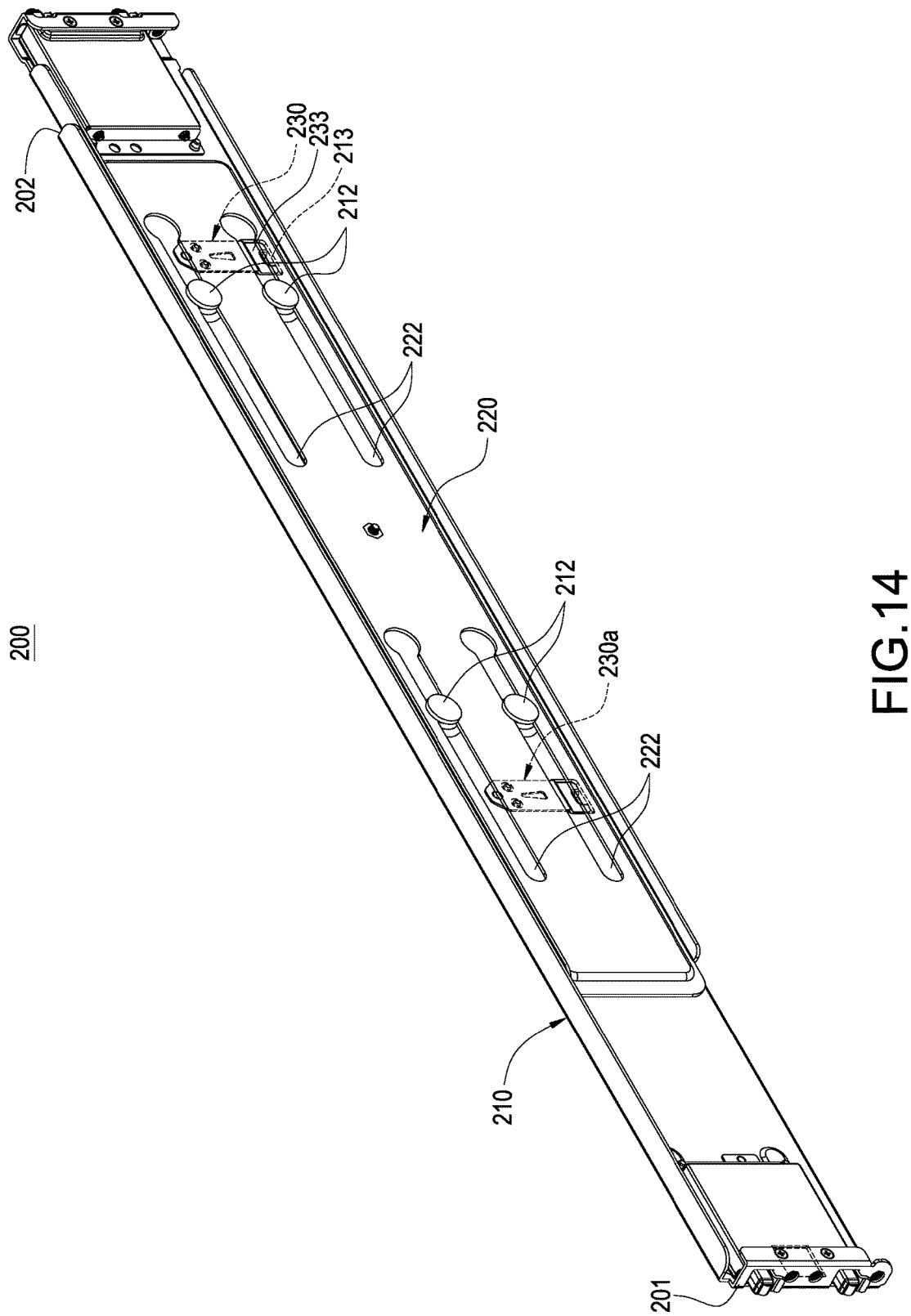
FIG. 14 is a schematic view illustrating the rail assembly in the server device according to another embodiment of the present invention.

Referring to FIG. 14, another positioning flexible arm 230a with the same structure is disposed on a middle section of the lateral board 210. When the front portion 300a of the server 300 is partially removed from the chassis 100, the positioning flexible arm 230a on the middle section of the lateral board 210 can be engaged with the engagement hole 301 of the server 300, thereby preventing the server 300 from toppling and entirely moving out of the chassis 100 when the front portion 300a of the server 300 suspends in the air. In the previous embodiment, the positioning flexible arm 230 is preferably arranged horizontally along a moving direction of the server 300; however, the present invention is not limited in this regard. The positioning flexible arm 230 can also be arranged vertically as shown in FIG. 14, wherein one end of the positioning flexible arm 230 is fixed at one side of the operation hole 213, the protruding portion 233 for engagement with the server 300 is formed on the other end of the positioning flexible arm 230, and the protruding portion 233 is inserted in the operation hole 213. The protruding portion 233 and the flange 203 protrude from the same side of the lateral board 210 as they do in the previous embodiment.

Figure 15:
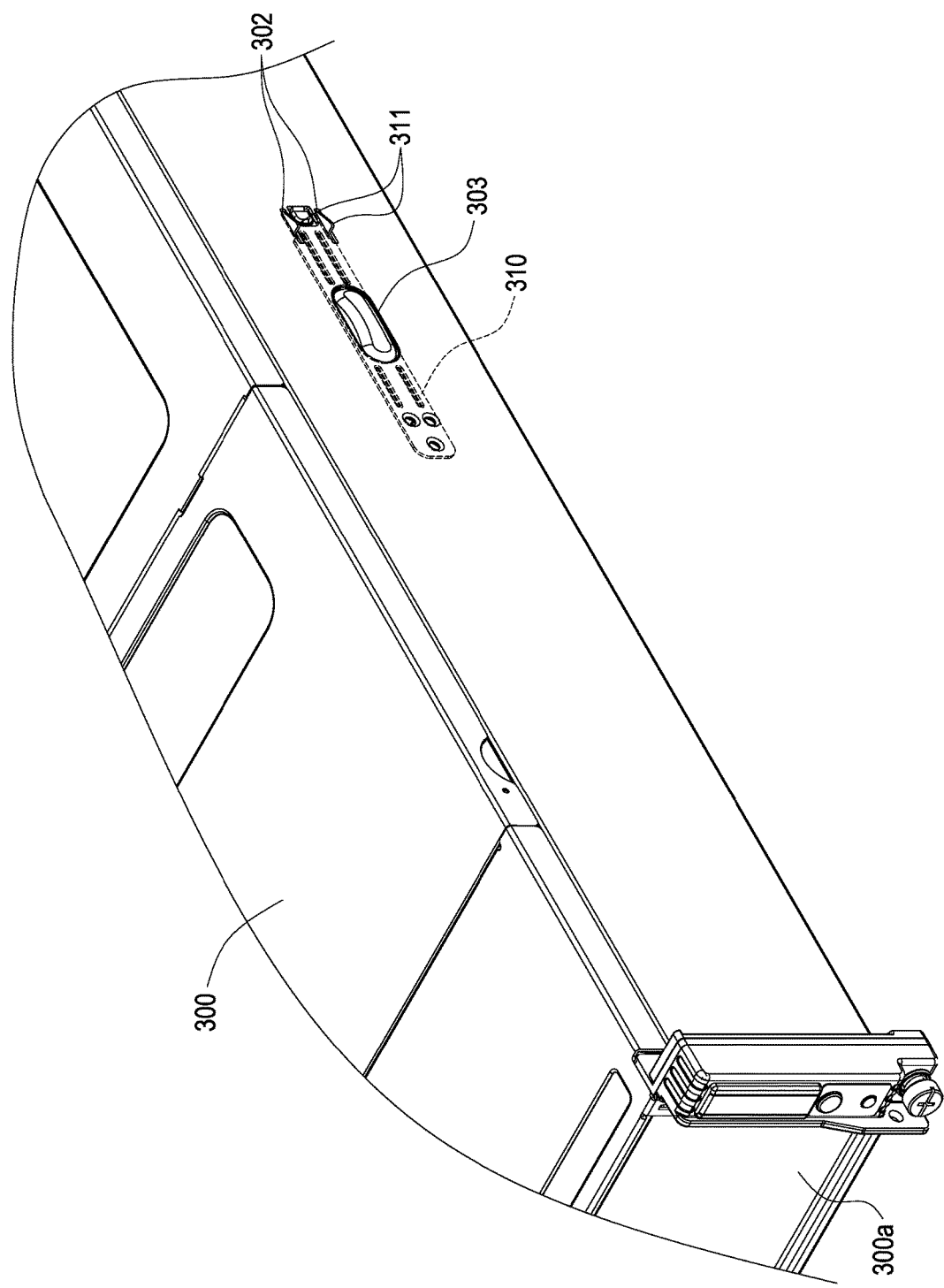
FIGS. 15 to 17 are schematic views illustrating a server in the server device according to another embodiment of the present invention.
Figure 16:
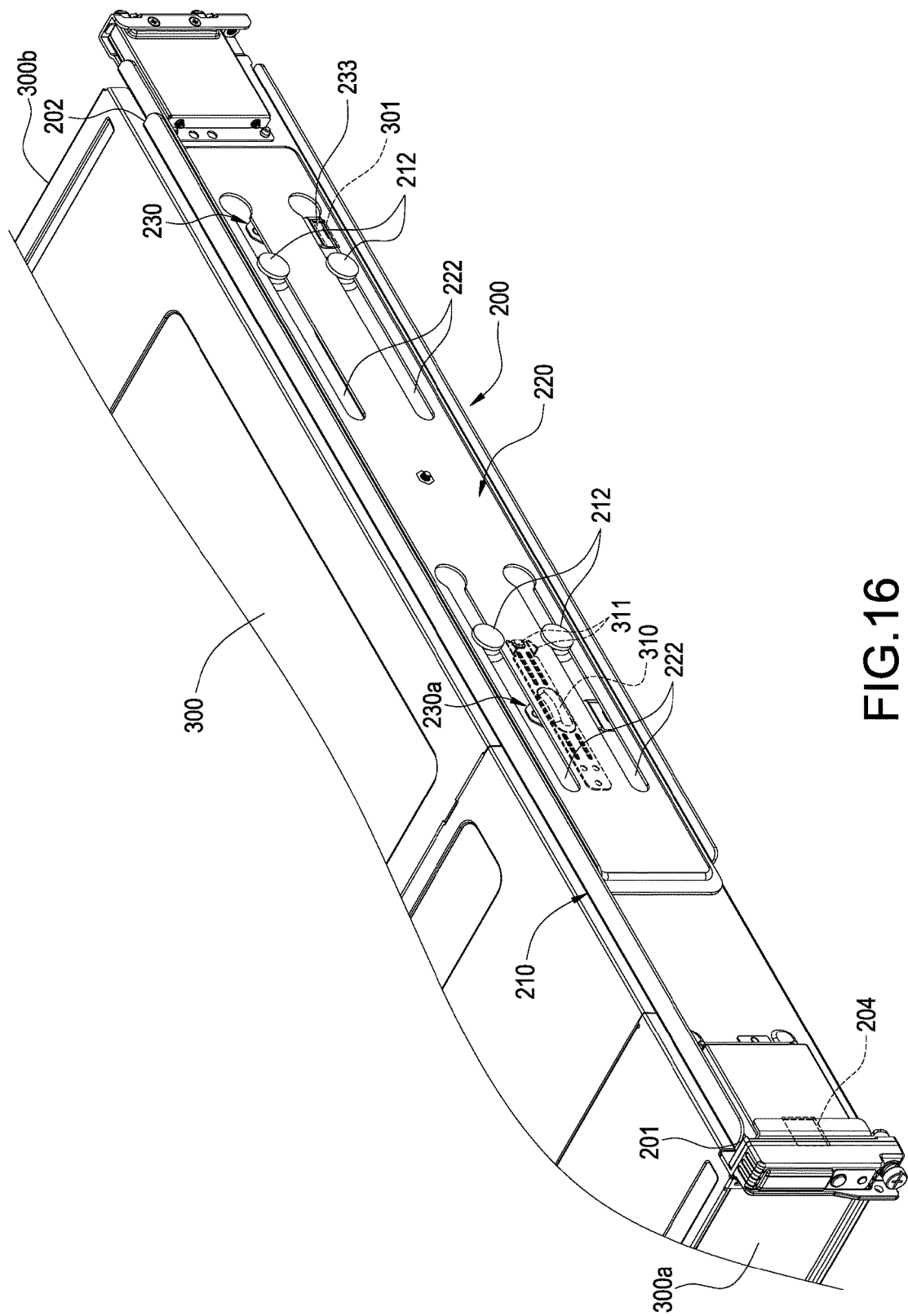
Figure 17:
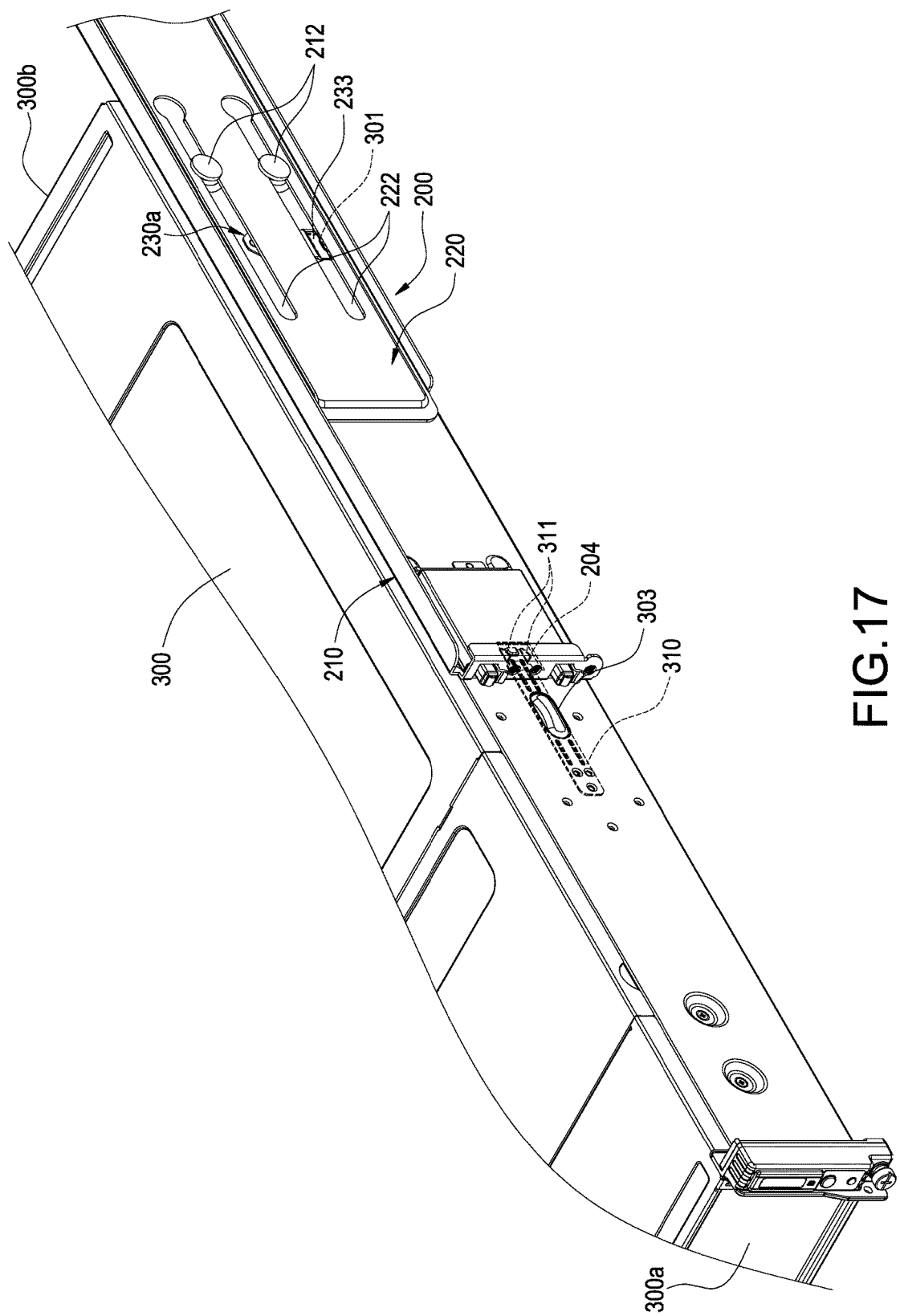

Referring to FIGS. 15 to 17, the server 300 can also have, on its side surface, a block flexible arm 310. The block flexible arm 310 is disposed on an inner surface of the server 300, one end of the block flexible arm 310 is oriented toward the front portion 300a of the server 300 and is fixed to the inner surface of the server 300. The other end of the block flexible arm 310 is disposed with a barb 311 and is oriented toward the rear portion 300b of the server 300. A through hole 302 is formed on a surface of the server 300, the barb 311 passes through the through hole 302 to protrude out of an outer surface of the server 300, and a release hole 303 corresponding to a middle section of the block flexible arm 310 is formed on the server 300. A block hole 204 is correspondingly formed on the lateral board 210. When the front portion 300a of the server 300 is pulled out of the chassis 100 to a predetermined position, the barb 311 is hooked into the block hole 204, so that the server 300 cannot be pulled out any further. Moreover, an operator can press the middle section of the block flexible arm 310 to remove the barb 311 from the block hole 204, so that the server 300 can be detached from the chassis 100.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A server device, comprising:
    a chassis;
    a rail assembly fixed inside the chassis, the rail assembly including a lateral board and a flange, the lateral board being arranged vertically, the flange protruding from one side of the lateral board, the flange being arranged horizontally and extending horizontally in a long strip shape, the rail assembly including a positioning flexible arm, the positioning flexible arm and the flange protruding from the same side of the lateral board; and
    a server, the server being loaded on the flange and slidable along the flange, the server including a front portion and a rear portion opposite to the front portion, wherein when the server is completely received in the chassis, the front portion is fixed to one end of the rail assembly, and the positioning flexible arm is engaged with an outer surface of the rear portion,
    wherein the rail assembly includes an extension board slidably connected to the lateral board;
    wherein the extension board is connected to the lateral board in an overlapping manner, one end of the lateral board is fixed to the chassis, and one end of the extension board is fixed to the chassis;
    wherein a slide groove is formed on the lateral board, and the extension board is disposed with a limiting pin correspondingly inserted in the slide groove;
    wherein the limiting pin is screw-connected to the extension board to compress and fix the lateral board to the extension board.

2. The server device of claim 1, wherein the positioning flexible arm is disposed at another end of the rail assembly.

3. The server device of claim 2, wherein another positioning flexible arm is disposed between two ends of the rail assembly so as to be engaged with the rear portion of the server when the server is partially removed from the chassis.

4. The server device of claim 1, wherein the flange is formed on an edge of the lateral board.

5. The server device of claim 1, wherein one end of the lateral board is fixed to the front portion, and the positioning flexible arm is disposed on another end of the lateral board.

6. The server device of claim 5, wherein another positioning flexible arm is disposed between two ends of the lateral board so as to be engaged with the rear portion of the server when the server is partially removed from the chassis.

7. The server device of claim 1, wherein a slide groove is formed on the extension board, and the lateral board is disposed with a limiting pin correspondingly inserted in the slide groove.

8. The server device of claim 7, wherein the limiting pin is screw-connected to the lateral board to compress and fix the extension board to the lateral board.

9. The server device of claim 1, wherein a slide groove is formed on the lateral board, the extension board is disposed with a limiting pin correspondingly inserted in the slide groove, and the lateral board is disposed with another limiting pin inserted in the corresponding another slide groove on the extension board.

10. The server device of claim 1, wherein an operation hole is formed on the lateral board, a protruding portion for engagement with the server is formed on a middle section of the positioning flexible arm, one end of the positioning flexible arm is fixed at one side of the operation hole, the protruding portion is inserted in the operation hole, and the protruding portion and the flange protrude from the same side of the lateral board.

11. The server device of claim 10, wherein a positioning slot and an assembly hole communicating with the positioning slot are disposed on another end of the positioning flexible arm, a positioning pin is arranged protrudingly at another side of the operation hole, a block portion is formed at a distal end of the positioning pin, the block portion has a width ranging between a width of the positioning slot and a diameter of the assembly hole, and the positioning pin is inserted in the positioning slot.

12. The server device of claim 1, wherein an operation hole is formed on the lateral board, one end of the positioning flexible arm is fixed at one side of the operation hole, a protruding portion for engaged with the server is formed on another end of the positioning flexible arm, the protruding portion is inserted in the operation hole, and the protruding portion and the flange protrude from the same side of the lateral board.

13. The server device of claim 1, wherein the server is disposed with a block flexible arm, one end of the block flexible arm is fixed to an inner surface of the server, a barb is disposed on another end of the block flexible arm, a through hole is formed on a surface of the server, the barb passes through the through hole to protrude out of an outer surface of the server, a block hole is formed on the lateral board, when the server is partially pulled out of the chassis, the barb is hooked into the block hole, so that the server cannot be pulled out any further.

14. The server device of claim 13, wherein a release hole corresponding to a middle section of the block flexible arm is formed on the server.

15. The server device of claim 1, wherein an engagement hole for engagement with the positioning flexible arm is formed on an outer surface of the server.

\* \* \* \* \*